United States Patent [19]

Robillard

[11] Patent Number: 4,770,738

[45] Date of Patent: Sep. 13, 1988

[54] ELECTRO HYDRODYNAMIC METHOD FOR THE PREPARATION OF A THIN SEMICONDUCTOR FILM

[75] Inventor: Jean J. A. Robillard, Castletroy, Ireland

[73] Assignee: The BOC Group plc, Windlesham, England

[21] Appl. No.: 918,561

[22] Filed: Oct. 14, 1986

[30] Foreign Application Priority Data

Oct. 4, 1985 [IE] Ireland ................................. 2445/85

[51] Int. Cl.⁴ ............................................. C30B 23/00
[52] U.S. Cl. .................................... 156/608; 156/609; 156/614; 156/615; 156/DIG. 89; 164/463; 164/122.1; 164/466
[58] Field of Search ............... 156/608, 609, 614, 615, 156/DIG. 89; 164/462, 463, 122, 122.1, 466

[56] References Cited

PUBLICATIONS

Directional Growth of Single-Crystal Silicon Films Across Silicon Carbide by a Moving Deposition-Zone Technique by R. L. Tallman et al., in Solid-State Electronics, 1966, Vol. 9, pp. 327–330.
Electrohydrodynamic Ion Source, by John F. Mahoney et al., in Journal of Applied Physics, vol. 40, No. 13, Dec. 1969.
Research and Development of a Charged-Particle Biopolar Thruster, by Julius Perel et al., in AIAA Journal, vol. 7, No. 3, Mar. 1969, pp. 507–511.

Primary Examiner—Asok Pal
Attorney, Agent, or Firm—Birch, Stewart, Kolasch & Birch

[57] ABSTRACT

A method of preparing a thin film of a semiconductor material on a substrate, in which charged microdroplets of the semiconductor material or a constituent thereof are generated by electrohydrodynamic (EHD) extraction of the droplets from a meniscus forced at an elongate tip of a nozzle containing the material in a molten state, the EHD extraction occurring under the influence of a high electric field produced by an extractor electrode adjacent the tip of the nozzle. The microdroplets are then accelerated away from the elongate tip of the nozzle to form a two-dimensional ribbon-like beam or blanket of the charged microdroplets. The two-dimensional beam is directed onto the trailing edge of a target carried on a moving substrate such that a film of the semiconductor material is formed on the substrate by deposition of the microdroplets on the trailing edge of the moving target.

26 Claims, 5 Drawing Sheets

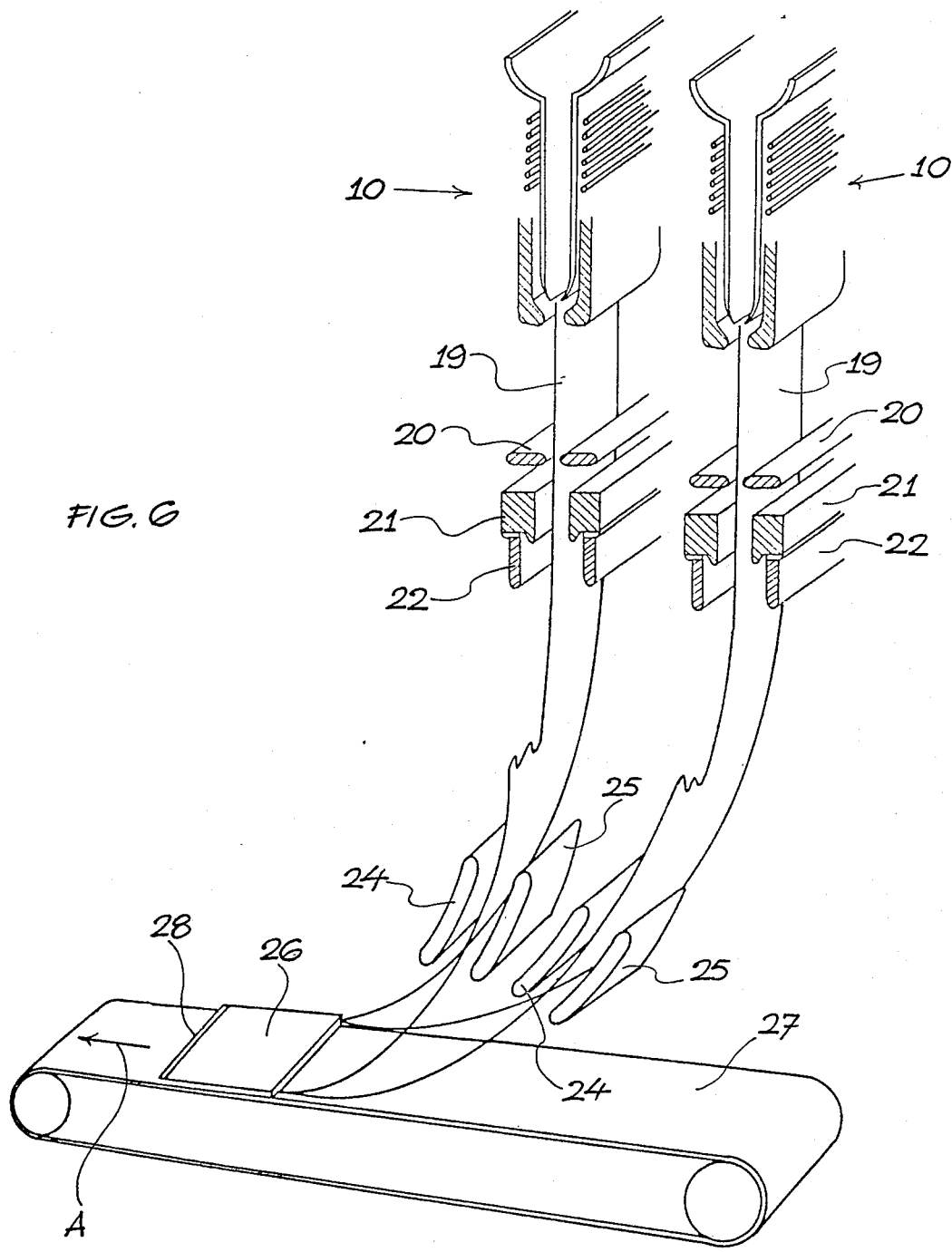

ELECTRO HYDRODYNAMIC METHOD FOR THE PREPARATION OF A THIN SEMICONDUCTOR FILM

BACKGROUND OF THE INVENTION

Field of the Invention

This invention relates to an electrohydrodynamic method for the preparation of a thin semiconductor film.

The prior art shows that the electrohydrodynamic technique is principally used as a research tool for testing properties of charged ions in electric propulsion sources. The full potential for the electrohydrodynamic technique for forming thin films has never been fully developed to an extent where the potential applications of this technique may be applied in a commercially useful sense.

SUMMARY AND OBJECT OF THE INVENTION

According to the present invention there is provided a method of preparing a thin film of a semiconductor material on a substrate, comprising generating charged microdroplets of the semiconductor material or a constituent thereof by electrohydrodynamic (EHD) extraction of the said droplets from a meniscus formed at an elongate tip of a nozzle containing the material in a molten state, the EHD extraction occurring under the influence of a high electric field produced by an extractor electrode adjacent the tip of the nozzle, accelerating the microdroplets so generated away from the elongate tip of the nozzle to form a two-dimensional ribbon-like beam or blanket of the charged microdroplets, and directing the two-dimensional beam onto the trailing edge of a target carried on a moving substrate such that a film of the semiconductor material is formed on the substrate by deposition of the microdroplets on the trailing edge of the moving target.

A single source (i.e. beam or blanket) of the semiconductor material may be used, but where the semiconductor material is a compound semiconductor it may be preferable to form a separate blanket of microdroplets in respect of different constituents of the compound semiconductor, the separate blankets either being merged prior to impact on the said trailing edge of the target, or meeting at the trailing edge.

Preferably the target is a monocrystalline seed crystal of the semiconductor material and the thin film of semiconductor material is substantially monocrystalline or at least polycrystalline. However, by using a target which does not promote crystalline growth of the semiconductor material, and/or by appropriately controlling the deposition conditions, amorphous films may be formed.

The method may further include forming a separate blanket of a semiconductor doping material, the blanket of doping material and the blanket of semiconductor material or a constituent thereof either being merged prior to impact on the trailing edge of the target, or meeting at the trailing edge, whereby a doped semiconductor film is produced.

The advantages of the EHD technique reside in the high transport rate of semiconductor particles as compared to atomic flow used in thermal evaporation techniques and chemical vapor deposition. The small droplets possess a large surface to volume ratio and their electric charge allows external control of the flow rate, direction and impact energy on the substrate as well as the conditions of growth of the deposited film.

The generation of microdroplets of liquid metals and other materials by the electrohydrodynamic technique is known (Electrodydrodynamic Ion Source (J. F. Mahoney, A. Y. Yahiku, H. L. Daley, R. D. Moore and J. Perel Journal of Applied Physics (1969) Volume 40 No. 13.). The technique is, however, invariably confined to the use of cylindrical nozzles providing single beams of droplets and is applied mostly to ionic propulsion (J. Pezel, J. F. Mahoney, R. D. Moore and A. Y. Yahiku AIAA J.7,507 (1969)). The generation of two dimensional blanket of particle is new in the art and particularly suitable for the preparation of high yield semiconductor films for microcircuit or solar cell applications. The deflection and focussing of charged particles by electron (or ion) optics is well known in the art and utilized currently in systems such as electron microscopes, ion microscopies, mass spectrographs, particle accelerators, etc.

The lateral growth of a thin monocrystalline film from the trailing edge of a seed on a moving substrate has also been investigated by several authors (Tallman R. L., T. L. Chu, J. J. Oberly Solid State Electronics 9, 327 (1966). However, none of this work has used a two dimensional blanket of liquid particles focussed on the trailing edge of the seed to provide a controlled impact energy sufficient to initiate the growth of a monocrystalline structure.

Embodiments of the invention will now be described, by way of example, with reference to the accompanying drawings, in which:

FIG. 6 is a part cross-sectional schematic perspective view of a further apparatus for performing a second embodiment of the invention.

DETAILED DESCRIPTION OF THE PREFERRED EMBODIMENTS

Figure 1:
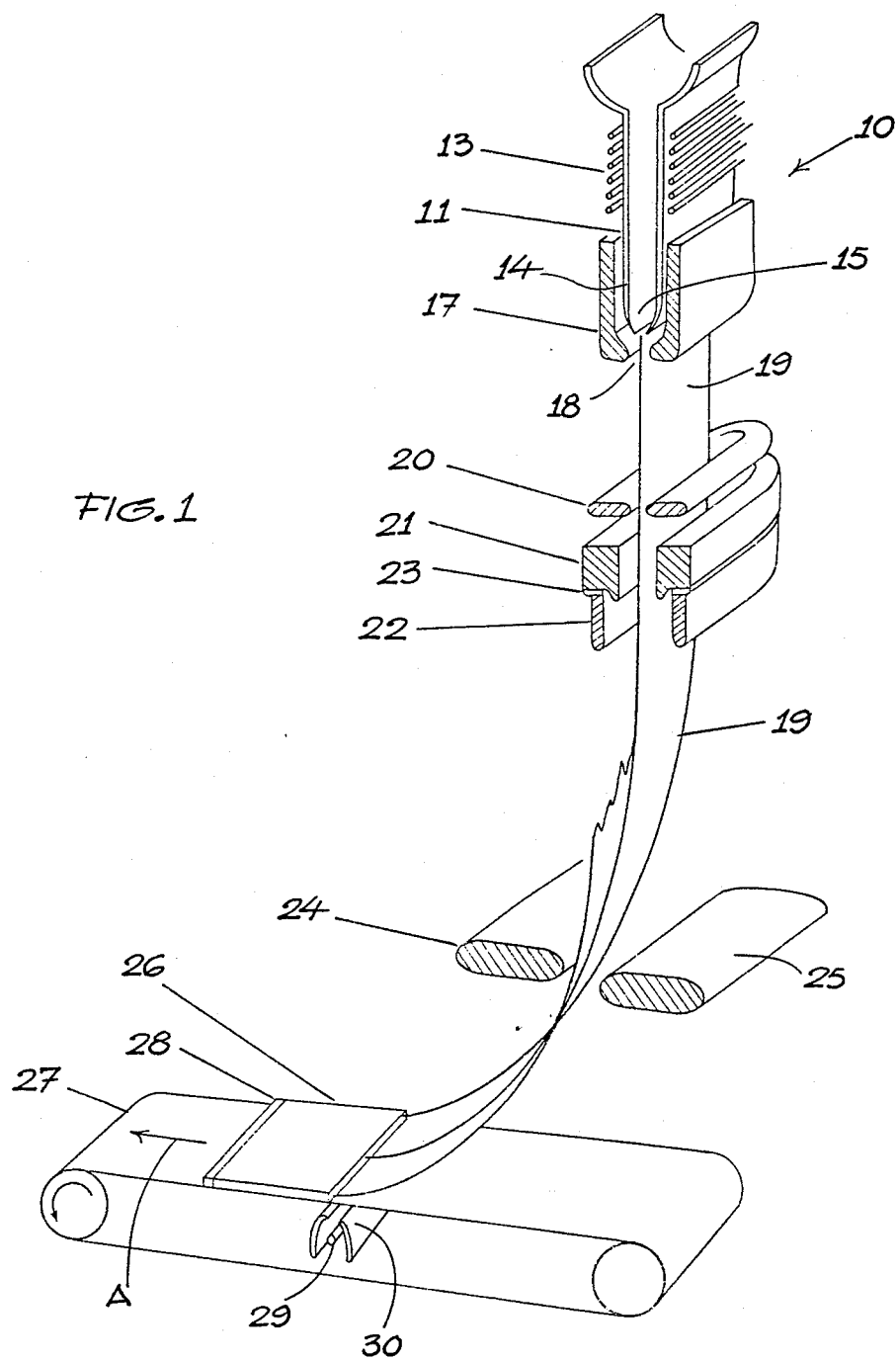
FIG. 1 is a part cross-sectional schematic perspective view of an apparatus for performing a first embodiment of the invention.
Figure 2:
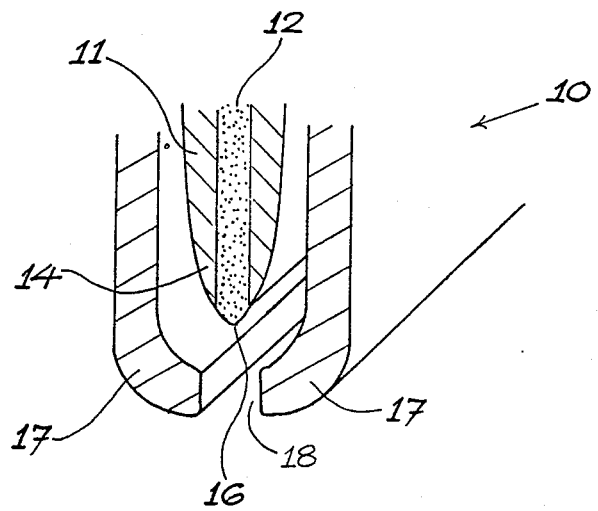
FIG. 2 is an enlarged cross-sectional perspective view of the microdroplet source forming part of FIG. 1.

Referring to FIGS. 1 and 2, the apparatus there shown comprises a source 10 of microdroplets of semiconductor material. In particular the source 10 includes a nozzle 11 of tungsten or other refractory material which is fed by capilliary action from a reservoir (not shown) of molten feedstock, i.e. semiconductor material 12. The material 12 in the nozzle 11 is kept molten by heat from an RF coil 13. The nozzle 11 has an elongate tip 14 which, as shown in FIG. 1, comprises a single elongate opening 15 at which a meniscus 16 of the molten semiconductor material 12 is formed.

The source 10 further includes an extractor electrode 17 closely embracing the tip 14 on either side and having an opening 18 vertically coincident with the opening 15. The nozzle 11 is maintained at a very high positive potential relative to the extractor electrode 17, typically 2 to 20 kV, whereby a very intense electrostatic field (e.g. $10^5$V/cm) is applied to the meniscus 16 of the material 12. The interaction between the electrostatic field and the surface tension of the meniscus 16 disrupts the semiconductor surface, resulting in a cloud of positively charged microdroplets of the semiconductor material being formed in the vincinity of the tip 14 of the nozzle 11.

The cloud of microdroplets formed at the nozzle 11 is accelerated away from the nozzle and focussed into a two-dimensional ribbon-like beam or blanket 19 by ion optic lenses 20, 21 and 22, including an insulator ring 23 for mounting the doublet lens system 21/22.

The blanket of charged droplets is then bent through 90° by two electrodes 24 and 25 to finally impinge on the trailing edge of a target 26 which is carried on a conveyor 27 moving in the direction indicated by the arrow A. The target 26 is initially a monocrystalline seed crystal 28 of the semiconductor material which is carried on a substrate which may be the surface of the conveyor 27 itself or a separate substrate (not shown) carried on the conveyor. The substrate may be sapphire, a glass ribbon or a metal foil enamelled on one side.

Deposition of the microdroplets onto the trailing edge of the seed crystal 28 starts an epitaxial growth process leading to the formation of a thin film as the substrate moves away from the point of impact at the same rate as the rate of growth of the film. Except at the beginning, when the seed crystal 28 constitutes the target, the growing film itself constitutes the target 26 upon whose trailing edge the beam or blanket 19 is directed.

To promote epitaxial growth, the trailing edge of the target 26 is locally heated by a tungsten filament 29 and anode 30 which together provide an upwardly directed electron beam extending across the width of the conveyor below the trailing edge of the growing film 26. This local heating provided by the elements 29 and 30 may not be necessary if the density and energy of the blanket of microdroplets is sufficient to provide the necessary heating at the trailing edge solely through dissipation of the kinetic energy of the microdroplets.

Thus, the film 26 is built up by the condensing microdroplets which are focussed as a blanket upon the trailing edge of the film, the temperature of the trailing edge being maintained at the temperature required for epitaxial growth of the film. To assist in the accurate deposition on the trailing edge, both seed and growing film are maintained at a suitable negative potential relative to the positively charged microdroplets. This may be achieved in conventional manner by the use of brushes or a liquid metal contact (not shown) to make electrical contact with the moving substrate.

Since the charged blanket is focussed on, and electrostatically attracted by the trailing edge of the condensing semiconductor film, only a few scattered ions of the semiconductor can condense ahead of the trailing edge and the danger of a heterogenous nucleation is correspondingly reduced.

Figure 5:
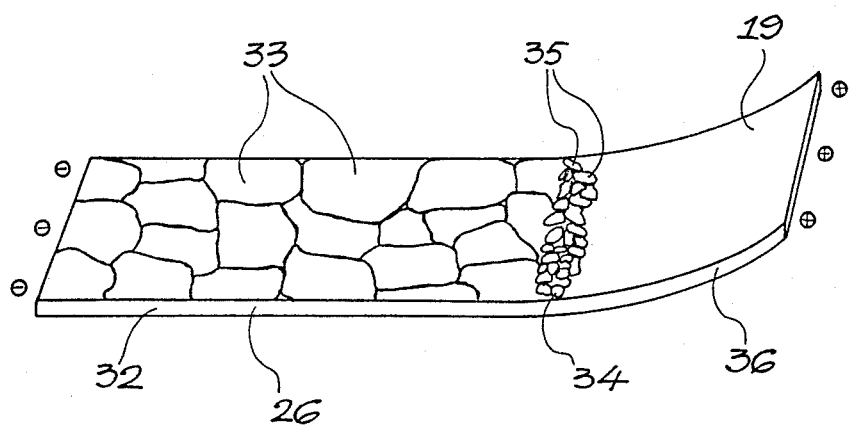
FIG. 5 is a schematic diagram of a semiconductor film during deposition, omitting the substrate on which it is formed.

In FIG. 5, there is shown the film 26 which is in the process of being grown on the substrate (not shown). The condensed solid portion 32 of the film has a generally polycrystalline structure having large crystallites 33. The region of the film indicated at 34 is in a substantially liquid state and has at this stage a plurality of somewhat smaller forming crystallites 35. The region indicated at 36 is the ribbon or blanket of semiconductor droplets 19. As the seed and film are kept at a negative potential relative to the ribbon of positively charged semiconductor droplets, the latter can effectively draw an electric current. The ribbon of droplets 19 can in fact draw a current sufficient to form a lower impedance path than that in the forming thin film 26. Thus, there is established a voltage drop across the thin film which is desired to merge the forming crystallites. In the forming film, particularly in the region 34, the conductivity within the crystallites is much higher than the conductivity at the interface between two adjacent crystallites. Thus, there is a potential drop across the interface between adjacent crystallites particularly in the lateral direction, from left to right in FIG. 5. This lateral potential drop across the boundaries of the crystallites, particularly in the region 34 tends to heat up the boundaries and is thus favourable for the merging and orientation of the forming crystallites into an epitaxial structure.

While such a potential drop is effective only for the total film in the case of a deposition under bias, the ion droplet blanket deposition allows the exertion of the field force directly during formation of the film structure and, therefore, eliminates a forming grain structure more efficiently.

The controllable variables in the electrohydrodynamic droplet generation method include, for example, the acceleration voltage, the electric field at the emitter, the emitter and extractor geometries, the material's physical properties, feed rate and the temperature.

Electrohydrodynamically generated droplets are controlled in terms of radius, charge-to-mass ratio and velocity. The droplet trajectory and impact energy are controllable by means of electric and magnetic fields. In general the droplet size can be increased by decreasing the electric field and/or by increasing the flow rate at the liquid feed. With increasing size the charge-to-mass ratio and the droplet velocity decrease and the time of flight from the source to the collector increases accordingly. The droplet velocity can be defined in terms of the charge-to-mass ratio and the accelerating voltage accoridng to $\frac{1}{2}mV^2$.

The EHD source current of the emitted droplets can be determined by:

$$I = q/m \times M$$

Where
I is the current of the source
M is the flow rate
q/m is the charge-to-mass ratio.

With different electrostatic field, particle sizes can be achieved for electrohydrodynamically formed particles ranging from several microns (up to the dimensions of the orifice of the capillary emitter) down to submicron (ions).

Other processing variables which affect particle size is the position of the extractor or acceleration electrode relative to the tip of the capillary emitter and the electrostatic field. A narrow distribution of particle sizes can be achieved and particle sizes ranging from about 0.01 micron to about 100 microns.

Temperature control of the feed material in the processing apparatus provides a precise control of feed material mass flow rate. Temperature also affects the thermal as well as electrical conductivities of the feed material so that the control of temperature also permits control of particle sizes, and particle size distribution.

It is to be understood that the entire apparatus of FIG. 1 is located in a vacuum chamber in use, the chamber being evacuated to $10^{-5}$ to $10^{-6}$ Torr.

Figure 3:
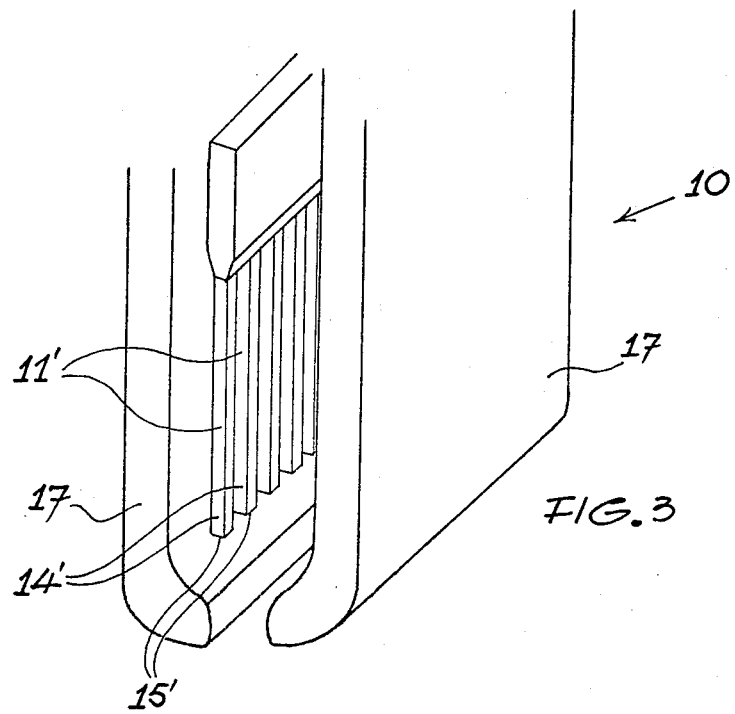
FIG. 3 is an enlarged cross-sectional perspective view of an alternative microdroplet source which may be used in the apparatus of FIG. 1.
Figure 4:
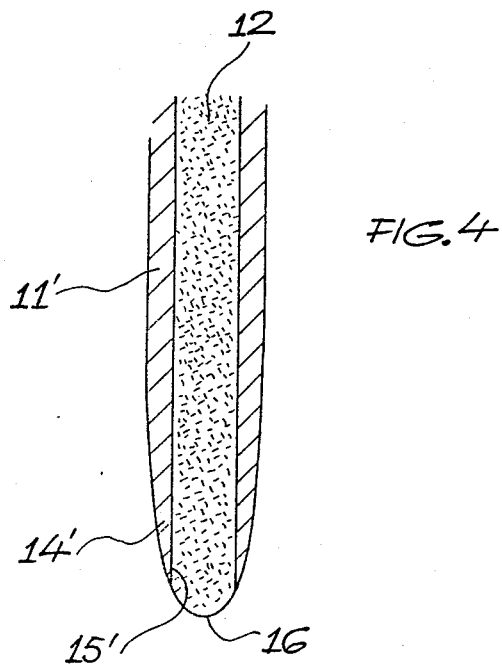
FIG. 4 is a cross-section through one of the individual capilliary nozzles of FIG. 3.

An alternative form of microdroplet source 10 is shown in FIGS. 3 and 4. In these figures the nozzle 5 includes a plurality of individual capilliary tubes 11' of refractory material connected to a common reservoir (not shown). The tips 14' of the tubes 11' are open at the bottom 15', the individual openings 15' forming a linear array. A meniscus 16 is formed at each of the openings 15'. In the source 10 shown in FIGS. 1 and 2 the width of the opening 15 is between $10^{-3}$ cm and $8 \times 10^{-3}$ cm, and in the source shown in FIGS. 3 and 4 the widths of the individual openings 15' lie in this same range.

A need for high purity material deposition may demand compound formation insitu. This can be solved by adopting the present technique in the case of a two source deposition converging on the trailing edge, see FIG. 6 where the same reference numerals have been used as in FIG. 1. While two source deposition is known as such, blanket deposition in this case is new and leads to a combination of better materials control with higher film perfection. It is known that the usual flash evaporation used for homopolar and heteropolar semiconductors is rather crude due to particle clustering and resulting growth defect.

It is also known that in vacuum deposition of compounds such as GaAs, the partial pressure of the vapor of the more volatile component would be higher than prescribed by stochiometry. It is also known that partial pressure in an evaporation rate of ionised molecules can be monitored with great accuracy. By using separate sources for the different constituents of a compound semiconductor film they can thus vary accurately the vapour composition and maintain conditions ideal for film deposition. By separate sources we do not only mean a separate microdroplet blanket for each constituent which meet only at the target but also separate sources of constituents with a common ion optical system for uniting and collimating the originally separate constituents prior to impact on the target. The same technique may be used for forming a doped semiconductor film.

Films build up according to the description can be used to deposit contacts and insulators for the formation of active devices, like MOS and FET devices. Due to the substrate movement, a part of the film, formed as a monocrystal, can immediately be processed in device structure or parts thereof.

A non limitative list of semiconductor materials applicable to the present invention include Si, Ge, GaAs, GaP, GaAs P, $Al_2As_3$, $Al_2S_3$, AlP, $SnO_2$, $TiO_2$, $ZnO_2$, $Bi_2O_3$, $Al_2O_3$, etc. deposited in single or compound layers from 0.1 to 50 μm thick.

In order to increase the local particle mobility at the forming film, additional film heaters can also be provided, as an example, an optical or electron beam heater can be positioned in the vicinity of the ion blanket on either side of the substrate and a radiation heater can supply radiative heat between the ion blanket and ground contact with the film. The optical or electron beam heater can be used for sharply defined local heating to promote epitaxial growth or contact may be used for annealing the film, and also for raising the semiconductor temperature to a point where it becomes more conductive and thus provides a sufficient electrically conductive path for the ion discharge current (FIG. 5).

I claim:

1. A method of preparing a thin film of a semiconductor material on a substrate, comprising:
   generating charged microdroplets of the semiconductor material or a constituent thereof by electrohydrodynamic (EHD) extraction of the said droplets from a meniscus formed at an elongate tip of a nozzle containing the material in a molten state, the EHD extraction occurring under the influence of a high electric field produced by an extractor electrode adjacent the tip of the nozzle,
   accelerating the microdroplets so generated away from the elongate tip of the nozzle to form a two-dimensional ribbon-like beam or blanket of the charged microdroplets, and
   directing the two-dimensional beam onto the trailing edge of a target carried on a moving substrate such that a film of the semiconductor material is formed on the substrate by deposition of the microdroplets on the trailing edge of the moving target.

2. A method according to claim 1, wherein the semiconductor material is a compound semiconductor, and a separate blanket of microdroplets is formed in respect of different constituents of the compound semiconductor, the separate blankets either being merged prior to impact on the said trailing edge of the target, or meeting at the trailing edge.

3. A method according to claim 1 wherein the target is a monocrystalline seed crystal of the semiconductor material and the thin film of semiconductor material is substantially monocrystalline or at least polycrystalline.

4. A method according to claim 3, further including forming a separate blanket of a semiconductor doping material, the blanket of doping material and the blanket of semiconductor material or a constituent thereof either being merged prior to impact on the said trailing edge of the target, or meeting at the trailing edge, whereby a doped semiconductor film is produced.

5. A method according to claim 1, wherein the elongate tip of the nozzle includes a single elongate opening at which the meniscus is formed.

6. A method according to claim 1, wherein the elongate tip of the nozzle includes a linear array of a plurality of individual openings at each of which a meniscus is formed.

7. The method of claim 1, wherein a voltage is applied between the extractor electrode and the nozzle of between 2 and 20 kV to provide the said high electric field.

8. The method of claim 5, wherein the width of the single nozzle opening, or the width of each individual nozzle opening, is from $10^{-3}$ cm to $8 \times 10^{-3}$ cm.

9. The method of claim 1, wherein the target on the moving substrate is negatively biased with respect to the positively charged microdroplets.

10. The method of claim 1, wherein additional heating is provided at the trailing edge of the target by directing an electron beam along the trailing edge.

11. The method of claim 1, which is carried out in a vacuum chamber at $10^{-5}$ to $10^{-6}$ Torr.

12. The method of claim 6, wherein the width of the single nozzle opening, or the width of each individual nozzle opening, is from $10^{-3}$ cm to $8 \times 10^{-3}$ cm.

13. A method according to claim 1, and further including the step of focusing the two-dimensional blanket prior to being positioned on said substrate.

14. A method of preparing a thin film of a semiconductor material on a substrate, comprising:

generating charged microdroplets of the semiconductor material or a constituent thereof by electrohydrodynamic (EHD) extraction of the said droplets from a meniscus formed at an elongate tip of a nozzle containing the material in a molten state, the EHD extraction occurring under the influence of a high electric field produced by an extractor electrode adjacent the tip of the nozzle;

accelerating the microdroplets so generated away from the elongate tip of the nozzle and focusing the microdroplets to form a two-dimensional ribbon-like beam or blanket of the charged microdroplets;

directing the two-dimensional beam onto the trailing edge of a target carried on a moving subsrate such that a film of the semiconductor material is formed on the substrate by deposition of the microdroplets on the trailing edge of the moving target; and heating said trailing edge of said target by directing an electron beam along the trailing edge for promoting epitaxial growth of said microdroplets.

15. A method according to claim 14, wherein said step of accelerating and focusing the microdroplets to form a two-dimensional ribbon-like beam or blanket of the charged microdroplets is achieved by ion optic lenses, including an insulator ring for mounting a doublet lens system.

16. A method according to claim 14, wherein the semiconductor material is a compound semiconductor, and a separate blanket of microdroplets is formed from different constituents of the compound semiconductor, the separate blankets either being merged prior to impact on the trailing edge of the target, or meeting at the trailing edge.

17. A method according to claim 14, wherein the target is a monocrystalline seed crystal of the semiconductor material and the thin film of semiconductor material is substantially monocrystalline or at least polycrystalline.

18. A method according to claim 15, further including forming a separate blanket of a semiconductor doping material, the blanket of doping material and the blanket of semiconductor material or a constituent thereof either being merged prior to impact on the trailing edge of the target, or meeting at the trailing edge, whereby a doped semiconductor film is produced.

19. A method according to claim 14, wherein the elongate tip of the nozzle includes a single elongate opening at which the menicus is formed.

20. A method according to claim 14, wherein the elongate tip of the nozzle includes a linear array of a plurality of individual openings at each of which a meniscus is formed.

21. The method of claim 14, wherein a voltage is applied between the extractor electrode and the nozzle of between 2 and 20 kV to provide the high electric field.

22. The method of claim 14, wherein the width of the single nozzle opening, of the width of each individual nozzle opening, is from $10^{-3}$ cm to $8 \times 10^{-3}$ cm.

23. The method of claim 14, wherein the target on the moving substrate is negatively biased with respect to the positively charged microdroplets.

24. The method of claim 14, which is carried out in a vacuum chamber at $10^{-5}$ to $10^{-6}$ Torr.

25. A method according to claim 14, wherein a tungsten filament and anode heat the trailing edge.

26. The method of claim 14, wherein the width of the single nozzle opening, or the width of each individual nozzle opening, is from $10^{-3}$ cm to $8 \times 10^{-3}$ cm.

* * * * *